(12) United States Patent
Fukutoyama et al.

(10) Patent No.: US 7,456,657 B2
(45) Date of Patent: Nov. 25, 2008

(54) COMMON INPUT/OUTPUT TERMINAL CONTROL CIRCUIT

(75) Inventors: Sadaharu Fukutoyama, Yokohama (JP); Masahiro Maeda, Yokohama (JP); Satoru Kagohashi, Yokohama (JP); Yuuji Kubo, Yokohama (JP); Yoshiharu Itou, Yokohama (JP); Atsushi Fujita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/490,151

(22) Filed: Jul. 21, 2006

(65) Prior Publication Data

US 2008/0001631 A1    Jan. 3, 2008

(30) Foreign Application Priority Data

Mar. 27, 2006  (JP)  .............................. 2006-086708

(51) Int. Cl.
*H03K 19/0175* (2006.01)

(52) U.S. Cl. ....................................................... 326/82

(58) Field of Classification Search ................... 326/30, 326/86, 82
See application file for complete search history.

(56) References Cited

U.S. PATENT DOCUMENTS 6,636,070 B1 * 10/2003 Altaf ........................... 326/38

FOREIGN PATENT DOCUMENTS

| JP | 2004-192051 A | | 7/2004 |
|---|---|---|---|
| KR | 20-1996-0037487 U | * | 10/1996 |
| KR | 10-1998-002333 A | * | 1/1998 |
| KR | 10-2001-7012511 A | * | 10/2000 |

* cited by examiner

*Primary Examiner*—Vibol Tan
*Assistant Examiner*—Matthew C Tabler
(74) *Attorney, Agent, or Firm*—Arent Fox LLP (57) ABSTRACT

A first data selection circuit selects a data signal among a plurality of data signals from a plurality of circuits, a first direction selection circuit selects a direction control signal of the same circuit among a plurality of direction control signals from these circuits. A data holding circuit and a direction holding circuit respectively hold the selected data signal and direction control signal. A second data selection circuit selects a data signal from the first data selection circuit or the data holding circuit. A second direction selection circuit selects the direction control signal from the first direction selection circuit or the direction holding circuit. An output circuit outputs, to a common input/output terminal, the data signal from the second data selection circuit in accordance with the direction control signal from the second direction selection circuit.

11 Claims, 12 Drawing Sheets

COMMON INPUT/OUTPUT TERMINAL CONTROL CIRCUIT

CROSS REFERENCE TO RELATED APPLICATIONS

This application is based upon and claims the benefit of priority from the prior Japanese Patent Application No. 2006-086708, filed Mar. 27, 2006, the entire contents of which are incorporated herein by this reference.

BACKGROUND OF THE INVENTION

1. Field of the Invention

The present invention relates to a general input/output (I/O) control, and to a common input/output terminal control circuit in a device having a common input/output terminal such as a CPU (Central Processing Unit) and the like.

2. Description of the Related Art

Conventionally, when a circuit is configured in which two or more functions can be selected for one general I/O pin, a method of switching signals using a selector is employed.

Figure 1A:
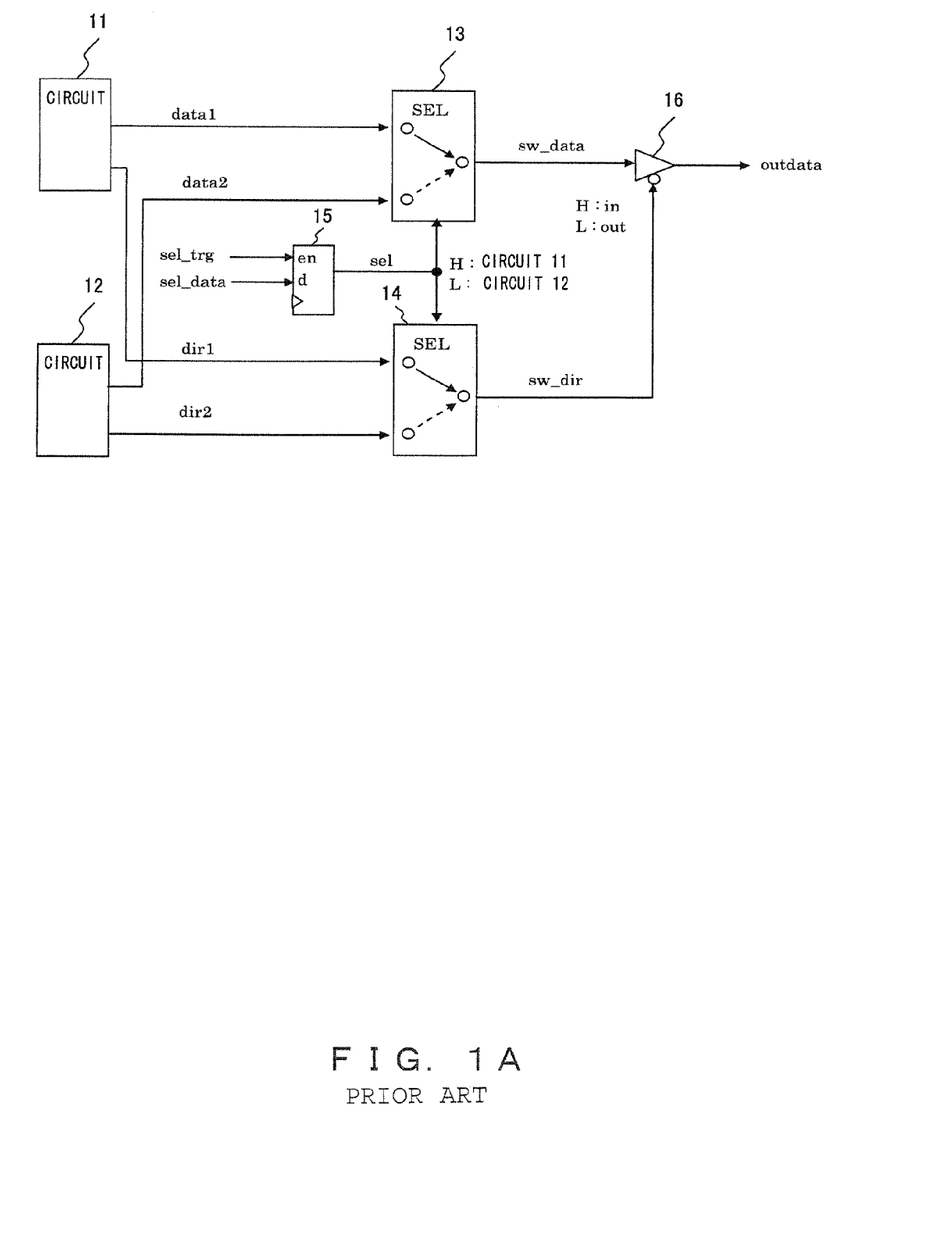
FIG. 1A shows a configuration of a conventional common input/output terminal control circuit.

FIG. 1A shows a configuration example of a conventional common input/output terminal control circuit as above. This control circuit comprises circuits 11 and 12, selectors 13 and 14, a latch circuit (register) 15, and a three-state-buffer 16, and performs a control such that the two circuits 11 and 12 use an I/O pin (not shown) in common provided on the output side of the three-state-buffer 16.

The circuits 11 and 12 respectively have different functions. The circuit 11 outputs a control signal dir1 specifying whether the direction of the I/O pin is the input or the output in accordance with the operation state of the circuit 11, and outputs a data signal data1 when the direction is the output. Similarly, the circuit 12 outputs a control signal dir2 specifying the direction of the I/O pin and a data signal data2.

The latch circuit 15 is configured of a flip flop for example, and latches a selection signal sel_data for switching the selectors 13 and 14, and outputs the signal as a selection signal sel.

The selector 13 selects data1 when the selection signal sel is High (logic "1"), selects data2 when the selection signal sel is Low (logic "0") and outputs the selected data signal as sw_data.

The selector 14 selects dir1 when the selection signal sel is the logic "1", and selects dir2 when the selection signal sel is the logic "0" in order to output the selected control signal as sw_dir. This control signal sw_dir is input to an enable terminal of the three-state-buffer 16 with a negative logic, and indicates that the direction of the I/O pin is the input with the logic "1", and indicates that the direction of the I/O pin is the output with the logic "0".

When the control signal sw_dir is the logic "1", the three-state-buffer 16 is in a high impedance state (input state) z, and the signal input from the I/O pin is transferred to the circuit 11 or the circuit 12 via a signal path (not shown). Also, when the control signal sw_dir is the logic "0", the three-state-buffer 16 is in an output state, and outputs the data signal sw_data to the I/O pin as outdata.

The Patent Document 1 below discloses a common terminal control device which realizes a switching of terminals even when software for the switching of terminals is not activated.

Patent Document 1

Japanese Patent Application Publication No. 2004-192051

The above conventional common input/output terminal control circuit has problems below.

Figure 1B:
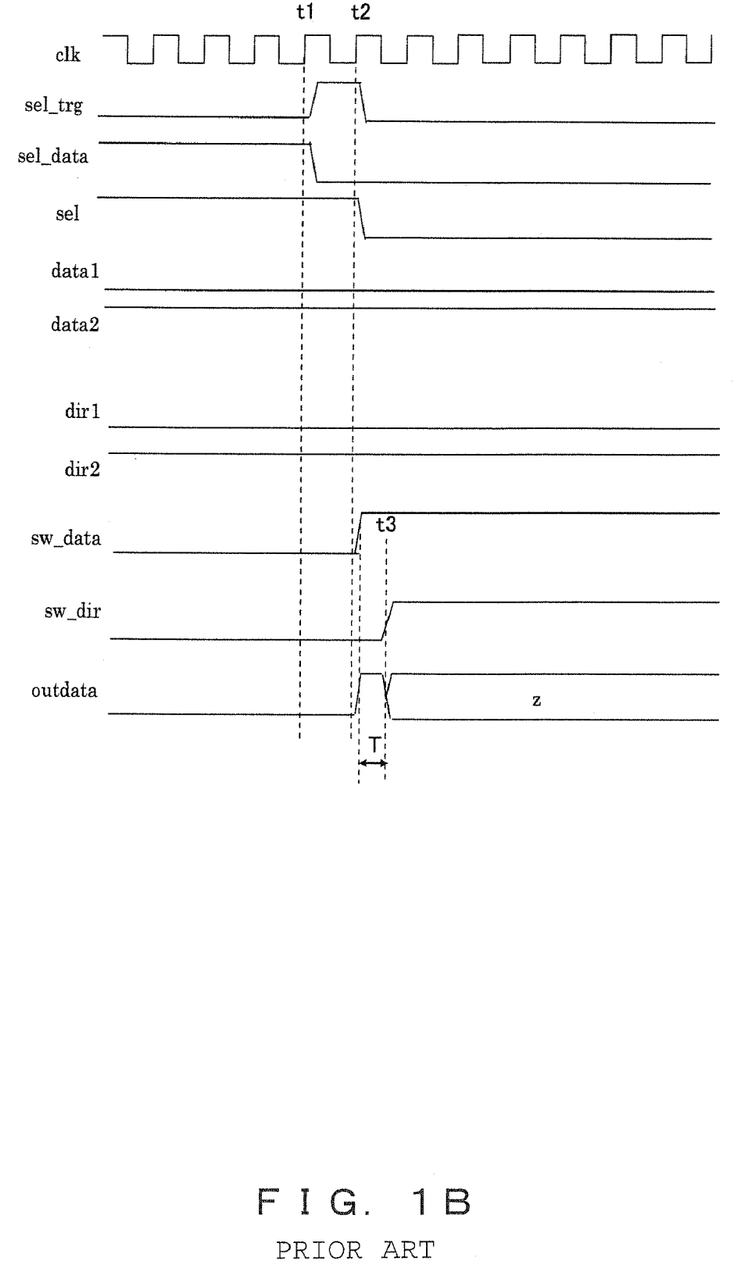
FIG. 1B shows a timing chart of a conventional first switching operation.
Figure 1C:
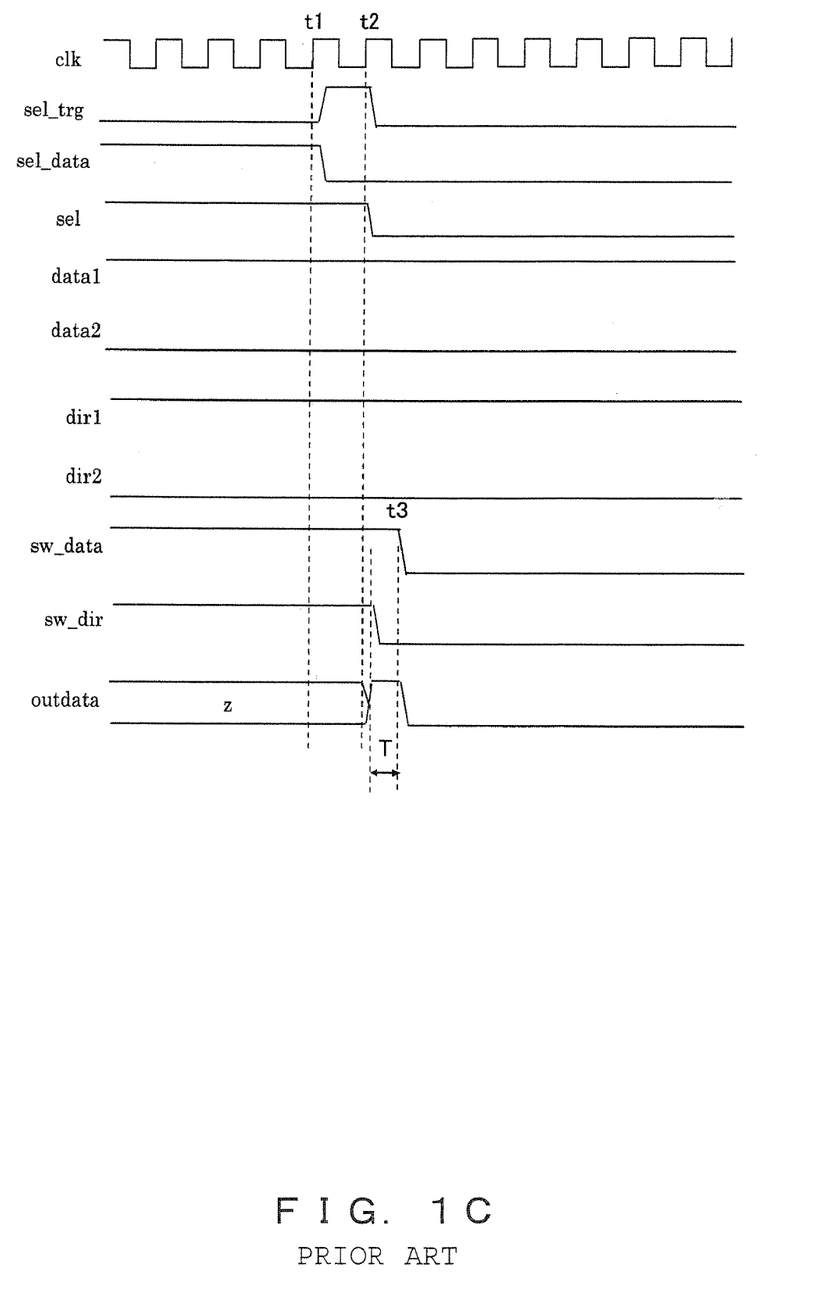
FIG. 1C shows a timing chart of a conventional second switching operation.

When the circuit configuration of FIG. 1A is employed, there is a probability that a hazard output occurs when switching between the circuits 11 and 12. FIG. 1B and FIG. 1C show timing charts of patterns of this hazard output.

The latch circuit 15 operates in accordance with a clock signal clk, and latches the selection signal sel_data on a rising edge of the clock signal, and outputs the latched signal as the selection signal sel. Accordingly, when the selection signal sel_data is switched from the logic "1" to the logic "0" at a time t1, the selection signal sel is switched from the logic "1" to the logic "0" at a time t2 which is posterior to the time t1 by one cycle.

First, it is assumed that the selection signal sel is switched from the logic "1" (circuit 11) to the logic "0" (circuit 12) at the time t2, and thereafter, the control signal sw_dir is switched from the logic "0" (output) to the logic "1" (input) at a time t3 posteriorly to the change of the data signal sw_data, as shown in FIG. 1B. In this case, during a period T between the time t2 and the time t3, the hazard output occurs.

Next, it is assumed that the selection signal sel is switched from the logic "1" to the logic "0" at the time t2, and thereafter, the control signal sw_dir is switched from the logic "1" to the logic "0" prior to the change of the data signal sw_data at the time t3, as shown in FIG. 1C. Also in this case, during the period T, the hazard output occurs.

A CPU chip manufactured in recent years employs a configuration in which a general I/O pins that can be applied to various usages are provided, and a signal to be connected to a particular I/O pin is selected by means of software, as a result of consideration of a limitation on the number of the I/O pins and generalization.

Figure 1D:
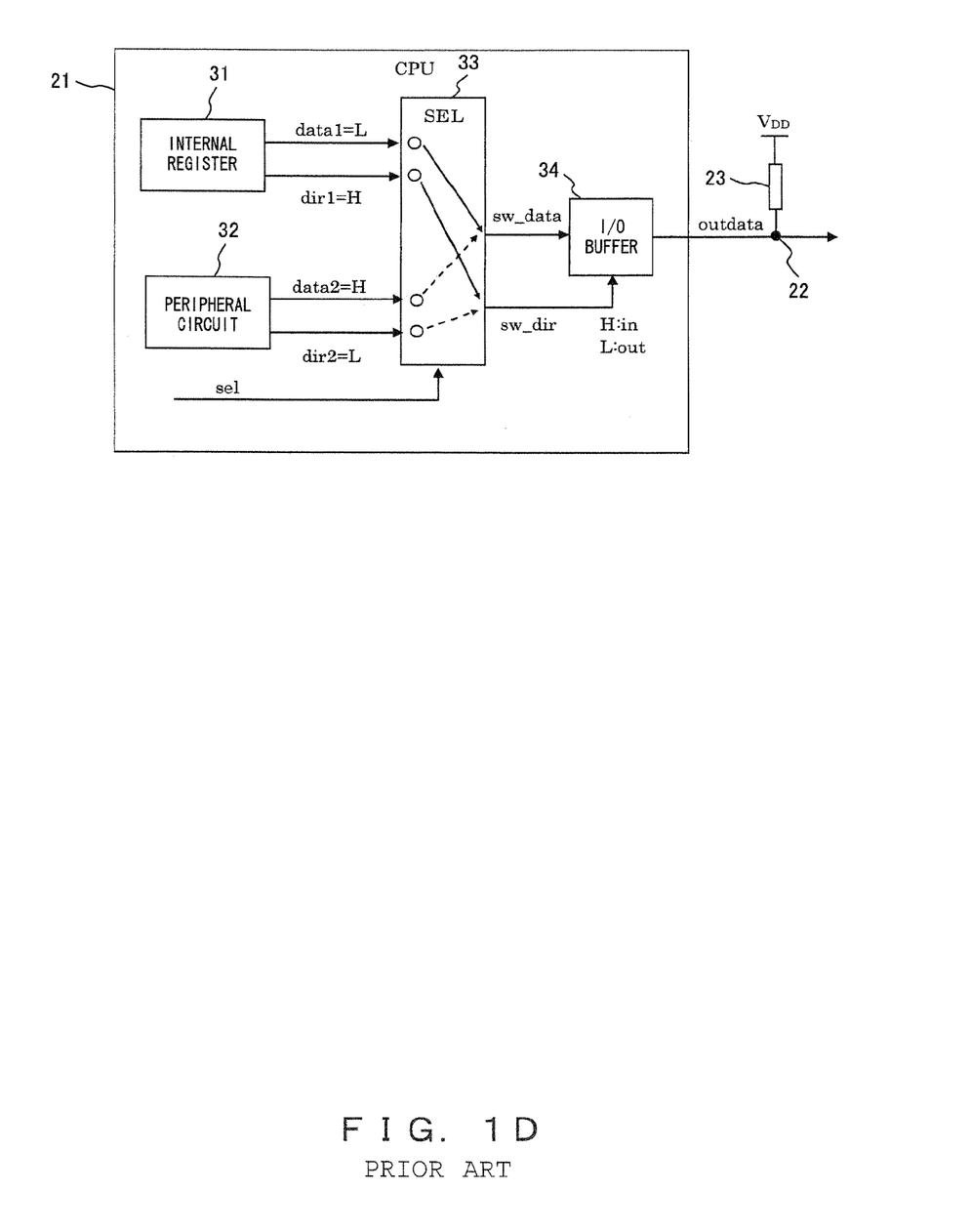
FIG. 1D shows a configuration of a common input/output terminal control circuit in a conventional CPU.
Figure 1E:
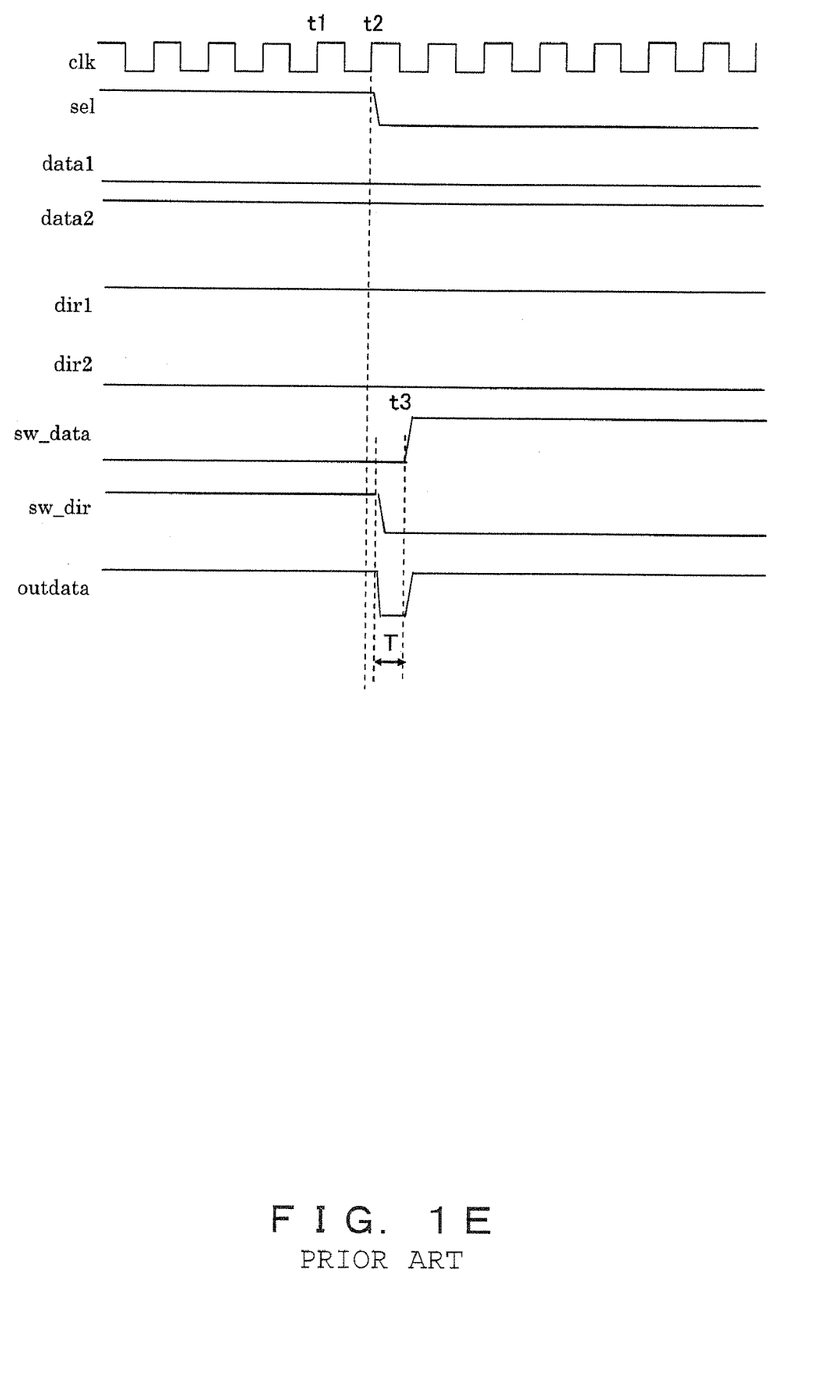
FIG. 1E shows a timing chart of a first switching operation in a conventional CPU.

FIG. 1D shows a configuration example of a common input/output terminal control circuit in the CPU chip as above. A CPU 21 of FIG. 1D comprises an internal register 31, a peripheral circuit 32, a selector 33, and an I/O buffer 34. An external I/O pin 22 is connected to a High level (VDD) via a load circuit 23, and is used for a signal input to the CPU 21 and a signal output from the CPU 21.

In the above case, the internal register 31 and the peripheral circuit 32 respectively correspond to the circuit 11 and the circuit 12 of FIG. 1A. The selector 33 corresponds to the selectors 13 and 14. The I/O buffer 34 corresponds to the three-state-buffer 16.

In a default (reset) state, the selector 33 always selects the internal register 31, and the I/O buffer 34 is in an input state. In this state, if the connection source of the I/O pin 22 is switched from the internal register 31 to the peripheral circuit 32 simply by means of software, there is a probability that the hazard output to the connection destination occurs.

When the connection is switched from the internal register 31 to the peripheral circuit 32, the control signal sw_dir is switched from the logic "1" to the logic "0", and the I/O buffer 34 is switched from the input state to the output state.

When the internal register 31 is selected, the I/O pin 22 is pulled up to the High level by the load circuit 23, therefore, the data signal outdata is logic "1". In this state, the connection is switched to the peripheral circuit 32, the output data signal data2 of the peripheral circuit 32 is also the logic "1", accordingly, the data signal outdata should not become the logic "0" even once. However, due to an internal delay, there is a probability that the hazard output of the logic "0" occurs instantaneously during the period T.

When the connection destination of the I/O pin 22 is a clock terminal or a write enable terminal of a circuit, the circuit operates on a rising edge of a signal, which has caused malfunction of the connection destination circuit. In order to prevent such a hazard output, suitable sequences have been prepared by means of software in the conventional techniques.

Figure 1F:
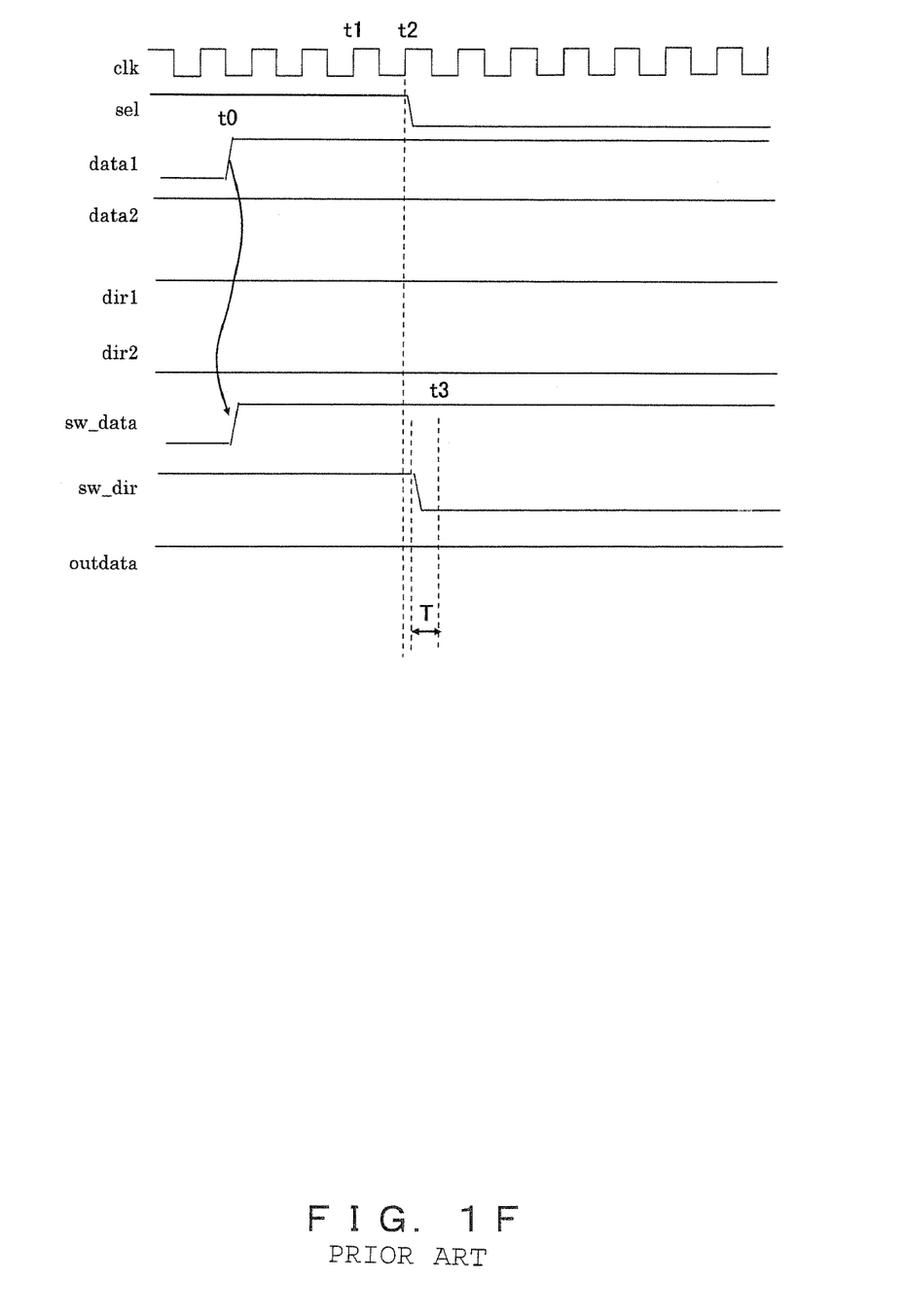
FIG. 1F shows a timing chart of a second switching operation in a conventional CPU.

In the example of FIG. 1D, it is possible to prevent the hazard output during the period T by changing the output data value of the internal register 31 from the logic "0" to the logic "1" prior to switching of the connection to the peripheral circuit 32, and thereafter using the selector 33 for switching, as shown in FIG. 1F.

However, the number of the I/O pins in the CPU chip tends to increase as the generalization advances, software control steps and check steps of the software sequences increase, and an automation of hazard cancellation is desired.

SUMMARY OF THE INVENTION

It is an object of the present invention to provide a common input/output terminal control circuit that prevents a hazard output from a general I/O pin without requiring software sequences.

A first common input/output terminal control circuit according to the present invention comprises first and second data selection circuits, a direction selection circuit, a data holding circuit, and an output circuit.

The first data selection circuit selects a data signal to be transferred to the common input/output terminal among a plurality of data signals respectively output from a plurality of circuits, and outputs the selected data signal. The direction selection circuit selects a direction control signal of the same circuit as the circuit of the data signal output from the first data selection circuit, and outputs the selected direction control signal. The data holding circuit holds the data signal output from the data selection circuit.

A second data selection circuit selects one of the data signal output from the first data selection circuit and the data signal held by the data holding circuit, and outputs the selected data signal. The output circuit outputs the data signal output from the second data selection circuit, to the common input/output terminal when the direction control signal output from the direction selection circuit indicates an output direction.

A second common input/output terminal control circuit according to the present invention comprises a data selection circuit, first and second direction selection circuits, a direction holding circuit, and an output circuit.

The data selection circuit selects the data signal to be transferred to the common input/output terminal among a plurality of data signals respectively output from a plurality of circuits, and outputs the selected data signal. The first direction selection circuit selects the direction control signal of the same circuit as the circuit of the data signal output from the data selection circuit among a plurality of direction control signals respectively output from the plurality of circuits, and outputs the selected direction control signal. The data holding circuit holds the direction control signal output from the first direction selection circuit.

The second direction selection circuit selects one of the direction control signal output from the first direction selection circuit and the direction control signal held by the direction holding circuit, and outputs the selected direction control signal. The output circuit outputs the data signal output from the data selection circuit, to the common input/output terminal when the direction control signal output from the second direction selection circuit indicates an output direction.

A third common input/output terminal control circuit according to the present invention comprises first and second data selection circuits, first and second direction selection circuits, a data holding circuit, a direction holding circuit, and an output circuit.

The first data selection circuit selects the data signal to be transferred to the common input/output terminal among a plurality of data signals respectively output from a plurality of circuits, and outputs the selected data signal. The first direction selection circuit selects a direction control signal of the same circuit as the circuit of the data signal output from the first data selection circuit, and outputs the selected direction control signal. The data holding circuit holds the data signal output from the first data selection circuit. The direction holding circuit holds the direction control signal output from the first direction selection circuit.

The second data selection circuit selects one of the data signal output from the first data selection circuit and the data signal held by the data holding circuit, and outputs the selected data signal. The second direction selection circuit selects one of the direction control signal output from the first direction selection circuit and the direction control signal held by the direction holding circuit, and outputs the selected direction control signal. The output circuit outputs the data signal output from the second data selection circuit, to the common input/output terminal when the direction control signal output from the second direction selection circuit indicates the output direction.

DESCRIPTION OF THE PREFERRED EMBODIMENTS

Hereinbelow, the most preferable embodiments of the present invention will be explained by referring to the drawings.

Figure 2:
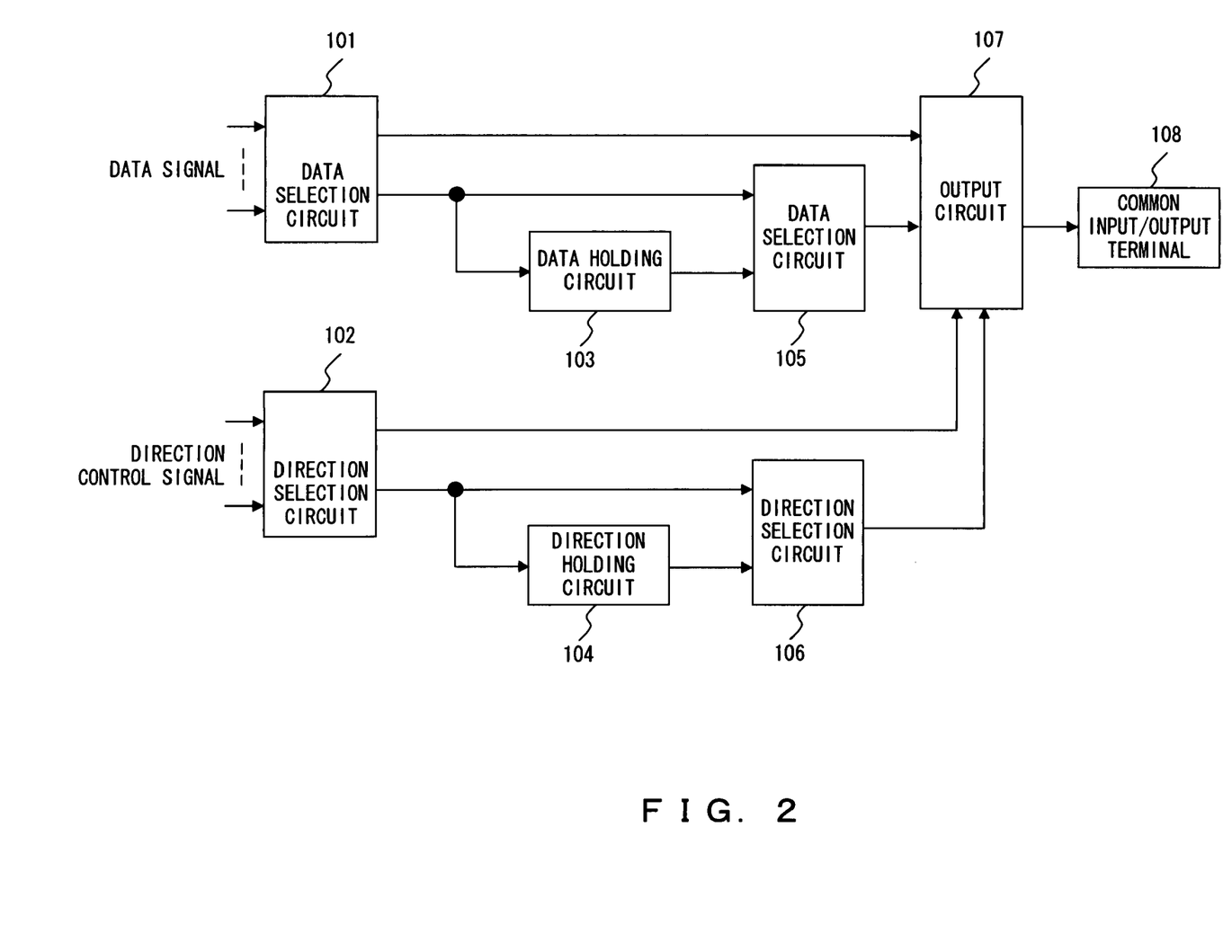
FIG. 2 is a principle view of a common input/output terminal control circuit according to the present invention.

FIG. 2 is a principle view of a common input/output terminal control circuit according to the present invention.

In a first aspect of the present invention, the common input/output terminal control circuit comprises data selection circuits 101 and 105, a direction selection circuit 102, a data holding circuit 103, and an output circuit 107.

The data selection circuit 101 selects the data signal to be transferred to a common input/output terminal 108 among a plurality of data signals respectively output from a plurality of circuits, and outputs the selected data signal. The direction selection circuit 102 selects the direction control signal of the same circuit as the circuit of the data signal output from the data selection circuit 101 among a plurality of direction control signals respectively output from the above plurality of circuits, and outputs the selected direction control signal. The data holding circuit 103 holds the data signal output from the data selection circuit 101.

The data selection circuit 105 selects one of the data signal output from the data selection circuit 101 and the data signal held by the data holding circuit 103, and outputs the selected data signal. The output circuit 107 outputs the data signal output from the data selection circuit 105, to the common input/output terminal 108 when the direction control signal output from the direction selection circuit 102 indicates the output direction.

The data signal output from the data selection circuit 101 is not transferred directly to the output circuit 107, but is transferred to the output circuit 107 via the data holding circuit 103 and the data selection circuit 105. In the data holding circuit 103, the data signal previously output from the data selection circuit 101 is held, accordingly, it is possible for the data selection circuit 105 to replace the current data signal with the previous data signal.

Accordingly, even when the direction control signal is switched from the output direction to the input direction posteriorly to the switching of the data signal as shown in FIG. 1B, it is possible to output the data signal before being switched instead of the data signal after being switched from the output circuit 107, accordingly, the hazard output is prevented.

In a second aspect of the present invention, the common input/output terminal control circuit comprises the data selection circuit 101, the direction selection circuits 102 and 106, a direction holding circuit 104, and the output circuit 107.

The data selection circuit 101 selects the data signal to be transferred to the common input/output terminal 108 among a plurality of data signals respectively output from a plurality of circuits, and outputs the selected data signal. The direction selection circuit 102 selects the direction control signal of the same circuit as the circuit of the data signal output from the data selection circuit 101 among a plurality direction control signals respectively output from the above plurality of circuits, and outputs the selected direction control signal. The direction holding circuit 104 holds the direction control signal output from the direction selection circuit 102.

The direction selection circuit 106 selects one of the direction control signal output from the direction selection circuit 102 and the direction control signal held by the direction holding circuit 104, and outputs the selected direction control signal. The output circuit 107 outputs the data signal output from the data selection circuit 101, to the common input/output terminal 108 when the direction control signal output from the direction selection circuit 106 indicates the output direction.

The direction control signal output from the direction selection circuit 102 is not transferred directly to the output circuit 107, but is transferred to the output circuit 107 via the direction holding circuit 104 and the direction selection circuit 106. In the direction holding circuit 104, the direction control signal previously output from the direction selection circuit 102 is held, accordingly, it is possible for the direction selection circuit 106 to replace the current direction control signal with the previous direction control signal.

Accordingly, even when the direction control signal is switched from the input direction to the output direction prior to the switching of the data signal as shown in FIG. 1C, it is possible to output the direction control signal before being switched instead of the data signal after being switched, to the output circuit 107. Thereby, it is possible to delay a timing at which the data signal is output from the output circuit 107, accordingly, the hazard output is prevented.

In a third aspect of the present invention, the common input/output terminal control circuit comprises the data selection circuits 101 and 105, the direction selection circuits 102 and 106, the data holding circuit 103, the direction holding circuit 104, and the output circuit 107.

The data selection circuit 101 selects the data signal to be transferred to the common input/output terminal 108 among a plurality of data signals respectively output from a plurality of circuits, and outputs the selected data signal. The direction selection circuit 102 selects the direction control signal of the same circuit as the circuit of the data signal output from the data selection circuit 101 among a plurality direction control signals respectively output from the above plurality of circuits, and outputs the selected direction control signal. The data holding circuit 103 holds the data signal output from the data selection circuit 101. The direction holding circuit 104 holds the direction control signal output from the direction selection circuit 102.

The data selection circuit 105 selects one of the data signal output from the data selection circuit 101 and the data signal held by the data holding circuit 103, and outputs the selected data signal. The direction selection circuit 106 selects one of the direction control signal output from the direction selection circuit 102 and the direction control signal held by the direction holding circuit 104, and outputs the selected direction control signal. The output circuit 107 outputs the data signal output from the data selection circuit 105, to the common input/output terminal 108 when the direction control signal output from the direction selection circuit 106 indicates the output direction.

By the above configuration, it is possible to prevent the hazard output in both cases of FIG. 1B and FIG. 1C.

In the common input/output terminal control circuit of FIG. 3 which will be explained later, the data selection circuits 101 and 105, the direction selection circuits 102 and 106, the data holding circuit 103, the direction holding circuit 104, and the output circuit 107 respectively correspond to the selectors 202, 235, 203, and 236, latch circuits 204 and 222, and a three-state-buffer 208.

In the common input/output terminal control circuit of FIG. 5 which will be explained later, the data selection circuits 101 and 105, the direction selection circuits 102 and 106, the data holding circuit 103, the direction holding circuit 104, and the output circuit 107 respectively correspond to selectors 502, 535, 503, and 536, latch circuits 504 and 522, and a three-state-buffer 508.

According to the present invention, in a device comprising the common input/output terminal such as a CPU or the like, the hazard output from the terminal is prevented when the direction of the terminal is switched from the output to the input posteriorly to the switching of the data signal and/or when the direction of the terminal is switched from the input to the output prior to the switching of the data signal.

Figure 3:
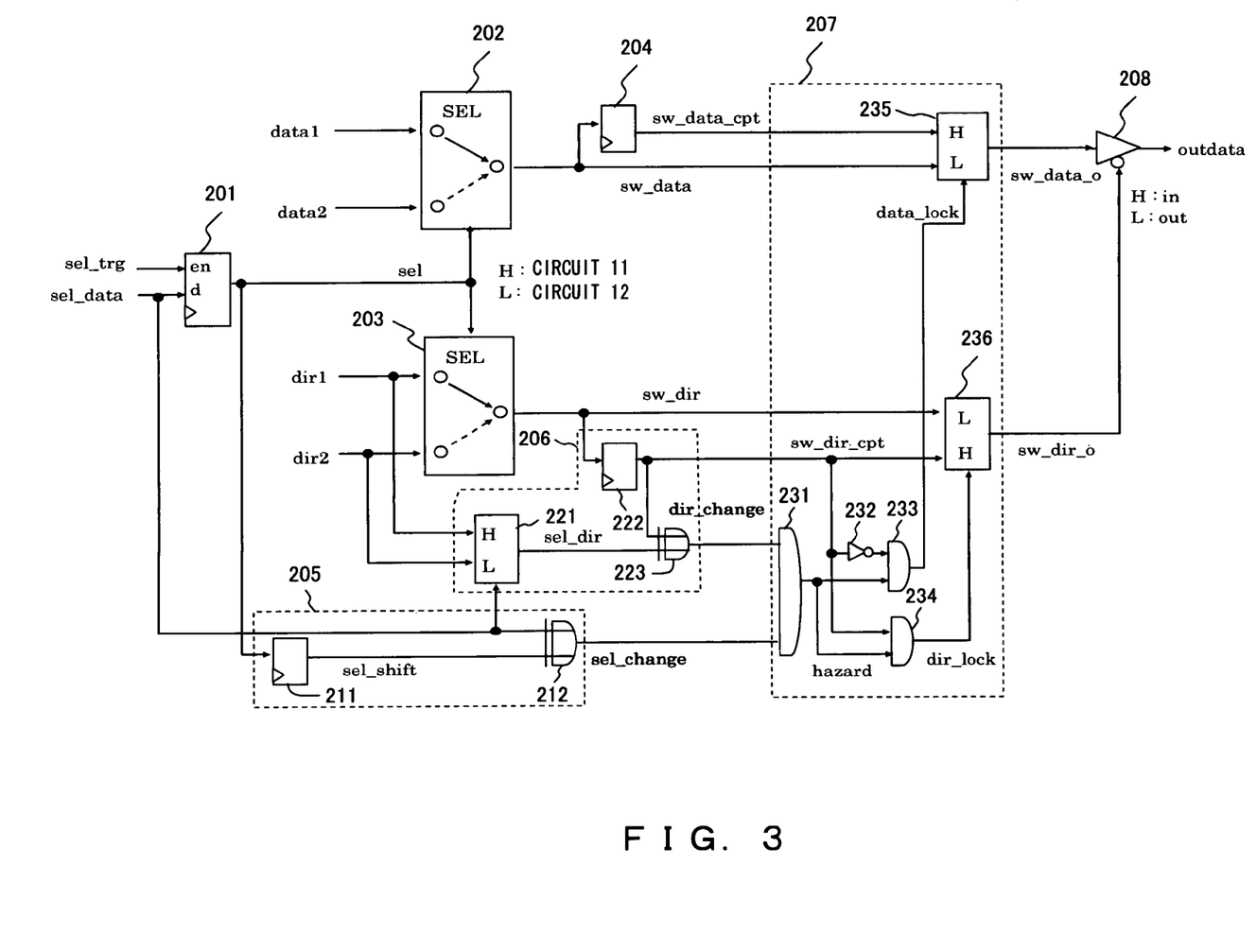
FIG. 3 shows a configuration of a first common input/output terminal control circuit.

FIG. 3 shows a configuration example in which an anti hazard circuit is provided in the common input/output terminal control circuit of FIG. 1A. This control circuit comprises the selectors 202 and 203, latch circuits 201 and 204, a selection signal comparator circuit 205, a direction control signal comparator circuit 206, a hazard condition detection circuit 207, and the three-state-buffer 208, and performs a control such that the two circuits 11 and 12 use the I/O pin (not shown) in common provided on the output side of the three-state-buffer 208.

Among the above elements, operations of the selectors 202 and 203, the latch circuit 201, and the three-state-buffer 208 are the same as those of the selectors 13 and 14, the latch circuit 15, and the three-state-buffer 16 of FIG. 1A.

The latch circuit 204 latches the data signal sw_data on a rising edge of the clock signal clk, and outputs the signal as the data signal sw_data_cpt. The data signal sw_data_cpt indicates the value of the data signal sw_data previous by one cycle.

The selection signal comparator circuit 205 comprises a latch circuit 211 and an XOR circuit 212, and compares the latest selection signal sel_data and the previous selection signal sel, and generates a signal sel_change indicating the comparison result.

The latch circuit 211 latches the selection signal sel on a rising edge of the clock signal clk, and outputs the signal as the selection signal sel_shift. This selection signal sel_shift indicates the value of the selection signal sel_data previous by two cycles. The XOR circuit 212 outputs the result of the exclusive OR operation between sel_data and sel_shift as the signal sel_change.

Accordingly, when the value of the latest selection signal sel_data and the value previous by two cycles are the same, the signal sel_change becomes the logic "0", and when the value of the latest selection signal sel_data and the value previous by two cycles are different, the signal sel_change becomes the logic "1". Thereby, the state change of the selection signal sel_data is detected.

The direction control signal comparator circuit 206 comprises a selector 221, a latch circuit 222, and an XOR circuit 223, and compares the latest control signal dir1 or dir2 and the previous control signal sw_dir, and generates a signal dir_change indicating the comparison result.

The selector 221 selects dir1 when the selection signal sel_data is the logic "1", selects dir2 when the selection signal sel_data is the logic "0", and outputs the selected control signal as sel_dir. This control signal sel_dir indicates the value of the control signal dir1 or dir2 selected based on the latest selection signal sel_data.

The latch circuit 222 latches the control signal sw_dir on a rising edge of the clock signal clk, and outputs the latched signal as the control signal sw_dir_cpt. This control signal sw_dir_cpt indicates the value of the control signal sel_dir previous by two cycles. The XOR circuit 223 outputs the result of the exclusive OR operation between sw_dir_cpt and sel_dir as the signal dir_change.

Accordingly, when the value of the latest control signal sel_dir and the value previous by two cycles are the same, the signal dir_change becomes the logic "0", and when the value of the latest control signal sel_dir and the value previous by two cycles are different, the signal dir_change becomes the logic "1". Thereby, the state change of the control signal sel_dir is detected.

The hazard condition detection circuit 207 comprises AND circuits 231, 233 and 234, an inverter 232, and the selectors 235 and 236, and detects a hazard condition from the signal sel_change and the signal dir_change, replaces the data signal sw_data or the control signal sw_dir with the value previous by one cycle, thereby, generates a data signal sw_data_o or a control signal sw_dir_o.

The AND circuit 231 outputs the result of AND operation between the signal sel_change and the signal dir_change as a hazard condition detection signal hazard. The inverter 232 outputs the negation of the control signal sw_dir_cpt. The AND circuit 233 outputs the result of the AND operation between the output of the inverter 232 and the signal hazard as a signal data_lock. The AND circuit 234 outputs the result of the AND operation between the control signal sw_dir_cpt and the signal hazard as a signal dir_lock.

The selector 235 selects the data signal sw_data_cpt when the signal data_lock is the logic "1", selects the data signal sw_data when the signal data_lock is the logic "0", and outputs the selected data signal as sw_data_o.

The selector 236 selects the control signal sw_dir_cpt when the signal dir_lock is the logic "1", selects the control signal sw_dir when the signal dir_lock is the logic "0", and outputs the selected control signal as sw_dir_o.

This control signal sw_dir_o is input to an enable terminal of the three-state-buffer 208 with a negative logic. Accordingly, the three-state-buffer 208 is in an input state when the control signal sw_dir_o is the logic "1", is in an output state when the control signal sw_dir_o is the logic "0", and outputs to the I/O pin the data signal sw_data_o as outdata.

According to the common input/output terminal control circuit as above, the hazard condition detection signal hazard becomes the logic "1", and the hazard condition detection circuit 207 operates such that the output of the hazard data is prevented when the conditions below (1) and (2) are satisfied simultaneously.
(1) When the value of the latest selection signal sel_data and the value previous by two cycles are compared, it is recognized that the value has changed (the signal sel_change is the logic "1").
(2) The direction of the control signal dir1 of the circuit 11 and the direction of the control signal dir2 of the circuit 12 are different (the signal dir_change is the logic "1").

When the conditions (1) and (2) are not simultaneously satisfied, the hazard data is not output, accordingly, a control of output of the data signal outdata can be performed completely regardless of timing.

Figure 4A:
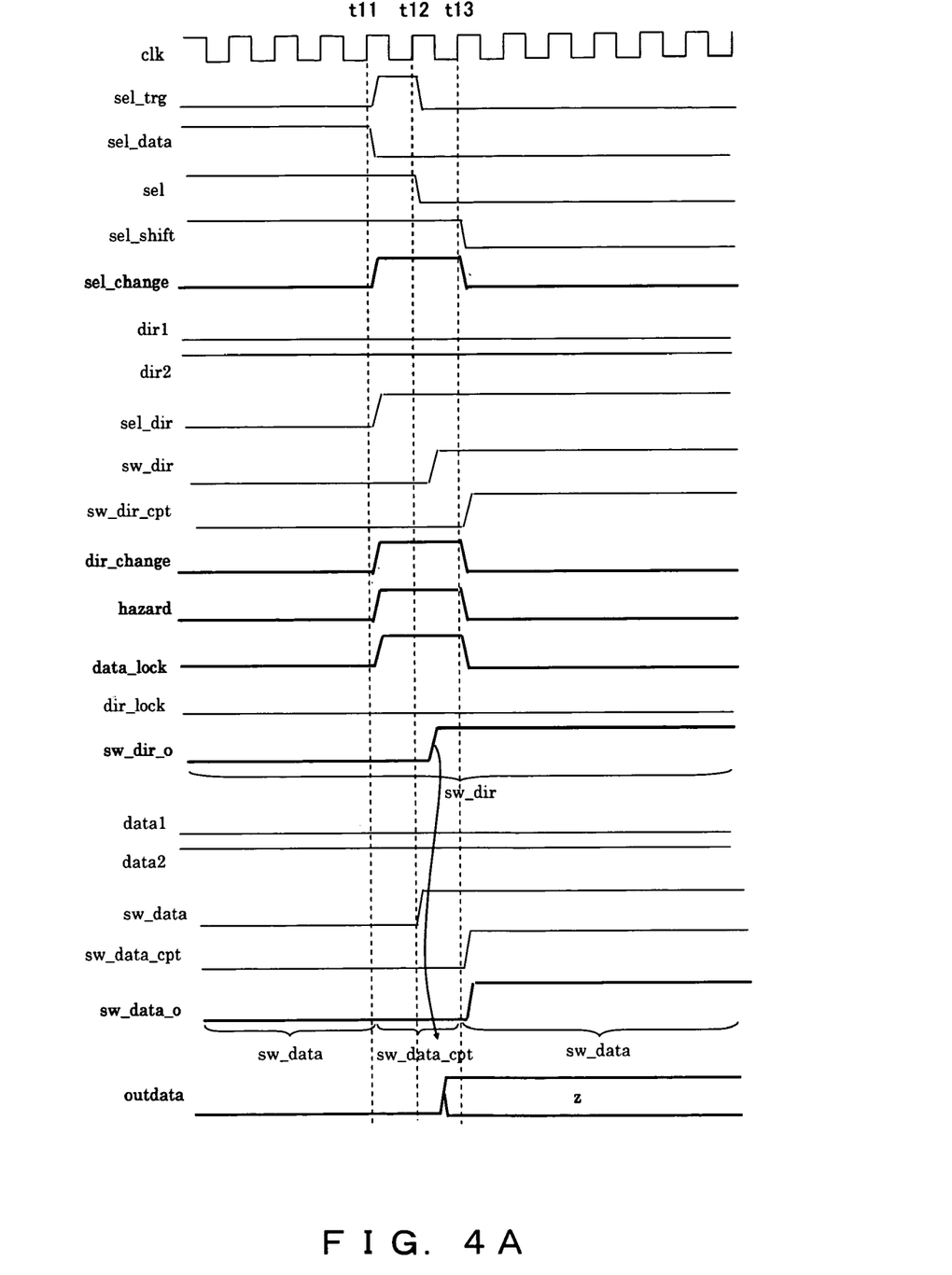
FIG. 4A shows a timing chart of a first switching operation.
Figure 4B:
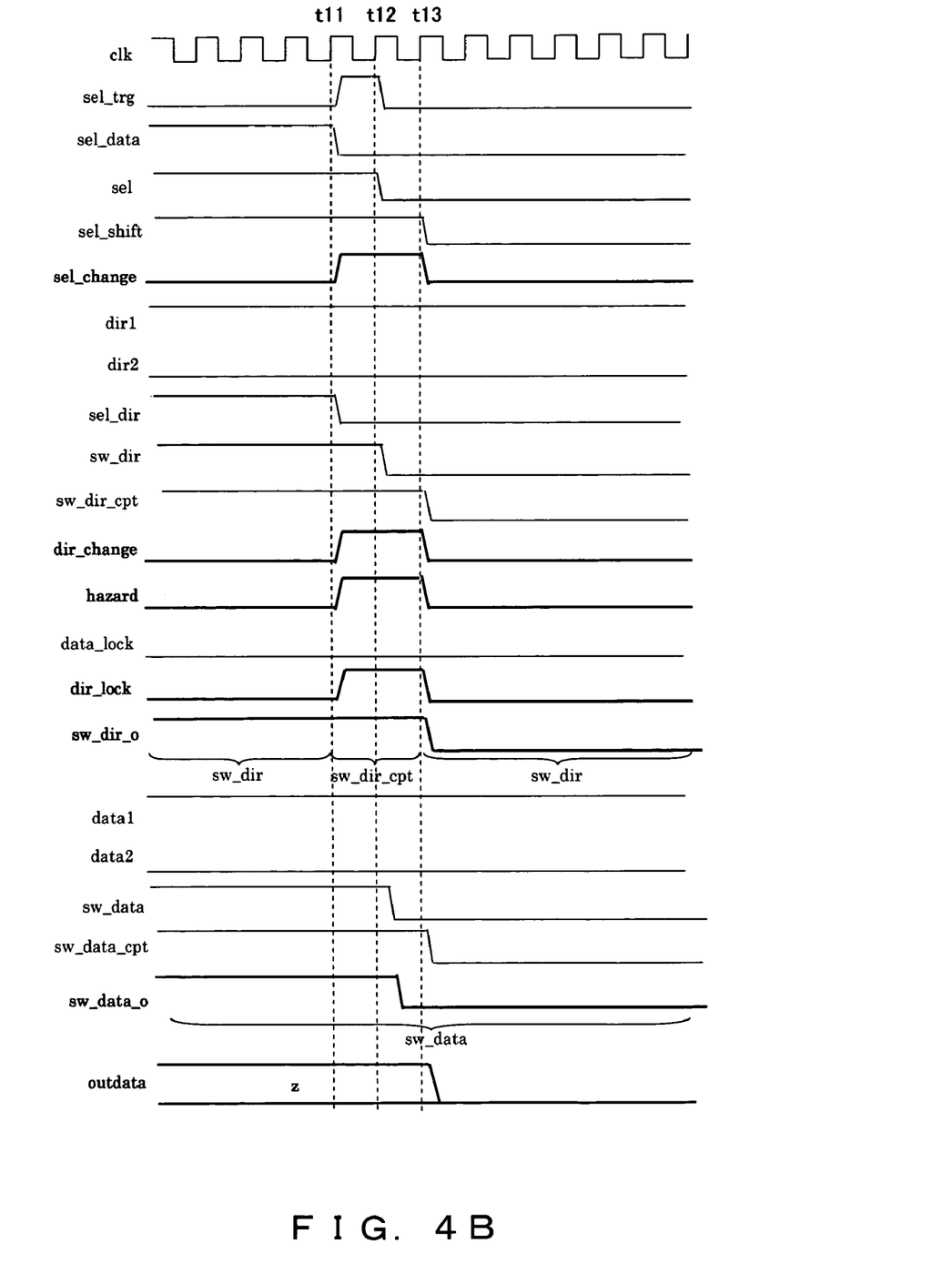
FIG. 4B shows a timing chart of a second switching operation.

FIG. 4A and FIG. 4B are timing charts showing that the hazard output is prevented when the conditions (1) and (2) are simultaneously satisfied.

First, in the timing chart of FIG. 4A, similarly to FIG. 1B, the selection signal sel is switched from the logic "1" to the logic "0" at time t12, and thereafter the control signal sw_dir is switched from the logic "0" to the logic "1" posteriorly to the change of the data signal sw_data. Thereafter, the selection signal sel_shift is switched from the logic "1" to the logic "0" at time t13.

Accordingly, during the period between a time t11 at which the selection signal sel_data changed and a time t13 at which the selection signal sel_shift changed, the signal sel_change is the logic "1". Similarly, during the period between the time t11 at which the control signal sel_dir changed and the time t13 at which the control signal sw_dir_cpt changed, the signal dir_change is also the logic "1". Accordingly, the signal hazard is the logic "1" during the two cycles between the time t11 and the time t13.

During the two cycles, the control signal sw_dir_cpt is the logic "0", accordingly, the signal data_lock is the logic "1", and the signal dir_lock is the logic "0". Accordingly, the data signal sw_data_cpt is output as sw_data_o, and the control signal sw_dir is output as sw_dir_o.

As above, based on the signal data_lock, the value of the data signal sw_data_o is fixed to the value of the data signal sw_data before changing, during the two cycles. Accordingly, the hazard data is not output as outdata even when the direction of the three-state-buffer 208 is switched based on the control signal sw_dir_o between the time t12 and the time t13.

Additionally, in the control circuit of FIG. 3, a configuration is employed in which the data signal sw_data is replaced with the data signal sw_data_cpt during the period of the two cycles between the time t11 and the time t13, however, it is possible to extend this period to a prescribed period of three cycles or more.

Next, in a timing chart of FIG. 4B, similarly to FIG. 1C, the selection signal sel is switched from the logic "1" to the logic "0" at the time t12, and thereafter the control signal sw_dir is switched from the logic "1" to the logic "0" prior to the change of the data signal sw_data. Thereafter, the selection signal sel_shift is switched from the logic "1" to the logic "0" at the time t13.

Thereby, similarly to the case of FIG. 4A, the signal sel_change is the logic "1" during the period of the two cycles between the time t11 and the time t13, and the signal dir_change is also the logic "1". Accordingly, the signal hazard is the logic "1" during the period of these two cycles.

During this period, the control signal sw_dir_cpt is the logic "1", accordingly, the signal data lock is the logic "0", and the signal dir_lock is the logic "1". Accordingly, the data signal sw_data is output as sw_data_o, and the control signal sw_dir_cpt is output as sw_dir_o.

As above, based on the signal dir_lock, the value of the control signal sw_dir_o is fixed to the value of the control signal sw_dir before changing, during the two cycles. Accordingly, the direction of the three-state-buffer 208 is not switched during the period between the time t12 and the time t13, and the hazard data is not output as outdata. In this period, the switching of the data signal sw_data_o is completed.

Additionally, in the control circuit of FIG. 3, a configuration is employed in which the control signal sw_dir is replaced with the control signal sw_dir_cpt during the period of the two cycles between the time t11 and the time t13, however, it is possible to extend this period to a prescribed period of three cycles or more.

Further, in the control circuit of FIG. 3, a configuration is employed in which the two circuits 11 and 12 use the I/O pin in common, however, the present invention can be applied to a configuration of three circuits or more. For example, when four circuits are to use the I/O pin in common, the configuration of the common input/output terminal control circuit is as shown in FIG. 5.

Figure 5:
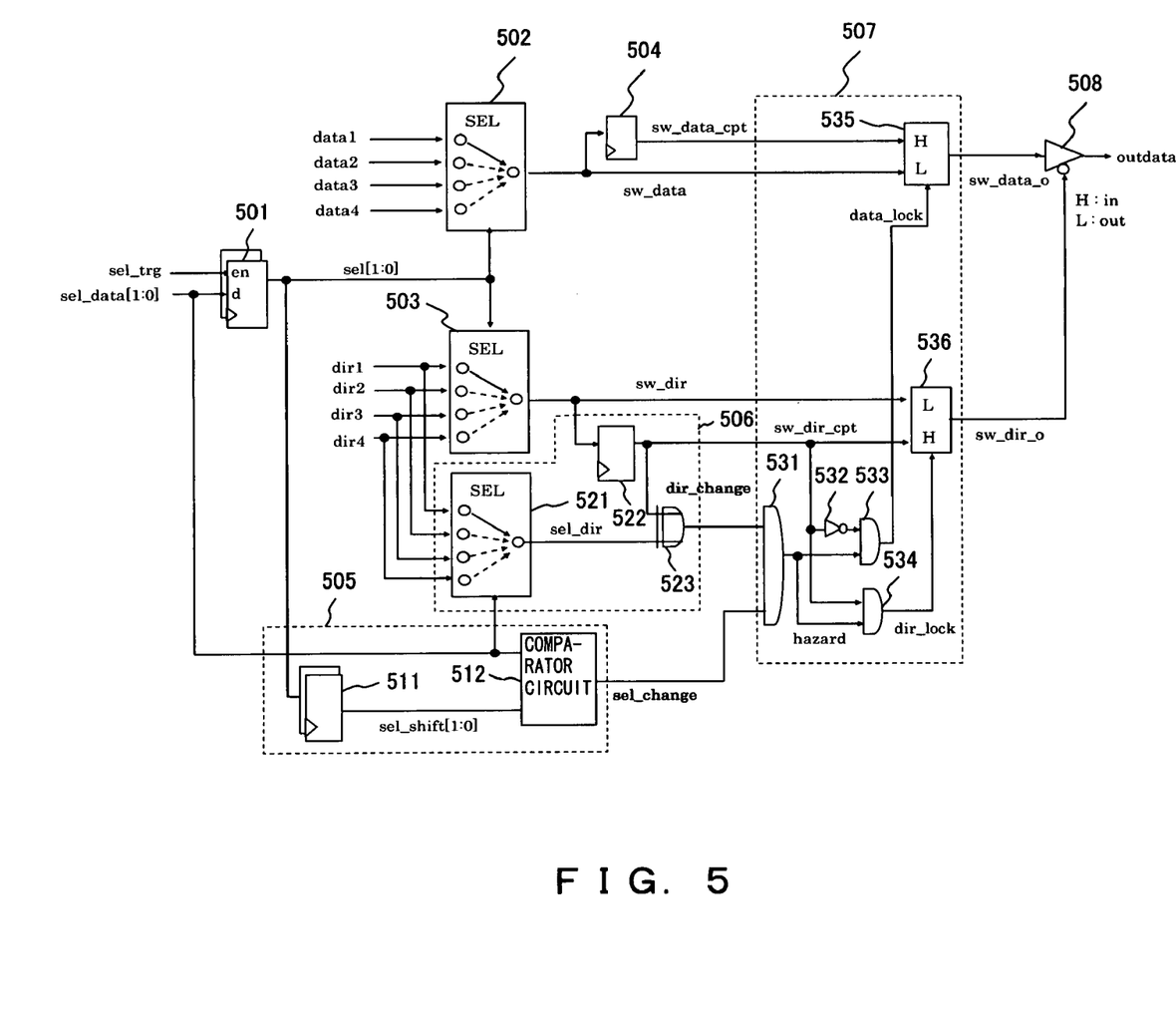
FIG. 5 shows a configuration of a second common input/output terminal control circuit.

The control circuit of FIG. 5 comprises the selectors 502 and 503, latch circuits 501 and 504, a selection signal comparator circuit 505, a direction control signal comparator circuit 506, a hazard condition detection circuit 507 and the three-state-buffer 508, and performs a control such that four circuits A, B, C, and D (not shown) use the I/O pin (not shown) in common provided on the output side of the three-state-buffer 508.

Among the above elements, operations of the latch circuit 504 and the three-state-buffer 508 are the same as those of the latch circuit 204 and the three-state-buffer 208 of FIG. 3.

The circuits A, B, C, and D respectively outputs data signals data1, data2, data3, and data4, and also respectively outputs the control signals dir1, dir2, dir3, and dir4.

The latch circuit 501 latches a selection signal sel_data[1:0] of two bits for switching the selectors 502 and 503, and outputs the latched signal as a selection signal sel[1:0].

The selector 502 selects data1 when the value of the selection signal sel[1:0] is "00", selects data2 when the value of the selection signal sel[1:0] is "01", selects data3 when the value of the selection signal sel[1:0] is "10", selects data4 when the value of the selection signal sel[1:0] is "11", and outputs the selected data signal as sw_data.

The selector 503 selects dir1 when a value of the selection signal sel[1:0] is "00", selects dir2 when the value is "01", selects dir3 when the value is "10", selects dir4 when the value is "11", and outputs the selected control signal as sw_dir.

The selection signal comparator circuit 505 comprises a latch circuit 511 and a comparator circuit 512, and compares the latest selection signal sel_data[1:0] and the previous selection signal sel[1:0], and generates a signal sel_change indicating the comparison result.

The latch circuit 511 latches the selection signal sel[1:0] on a rising edge of the clock signal clk, and outputs the latched signal as the selection signal sel_shift[1:0].

Figure 6:
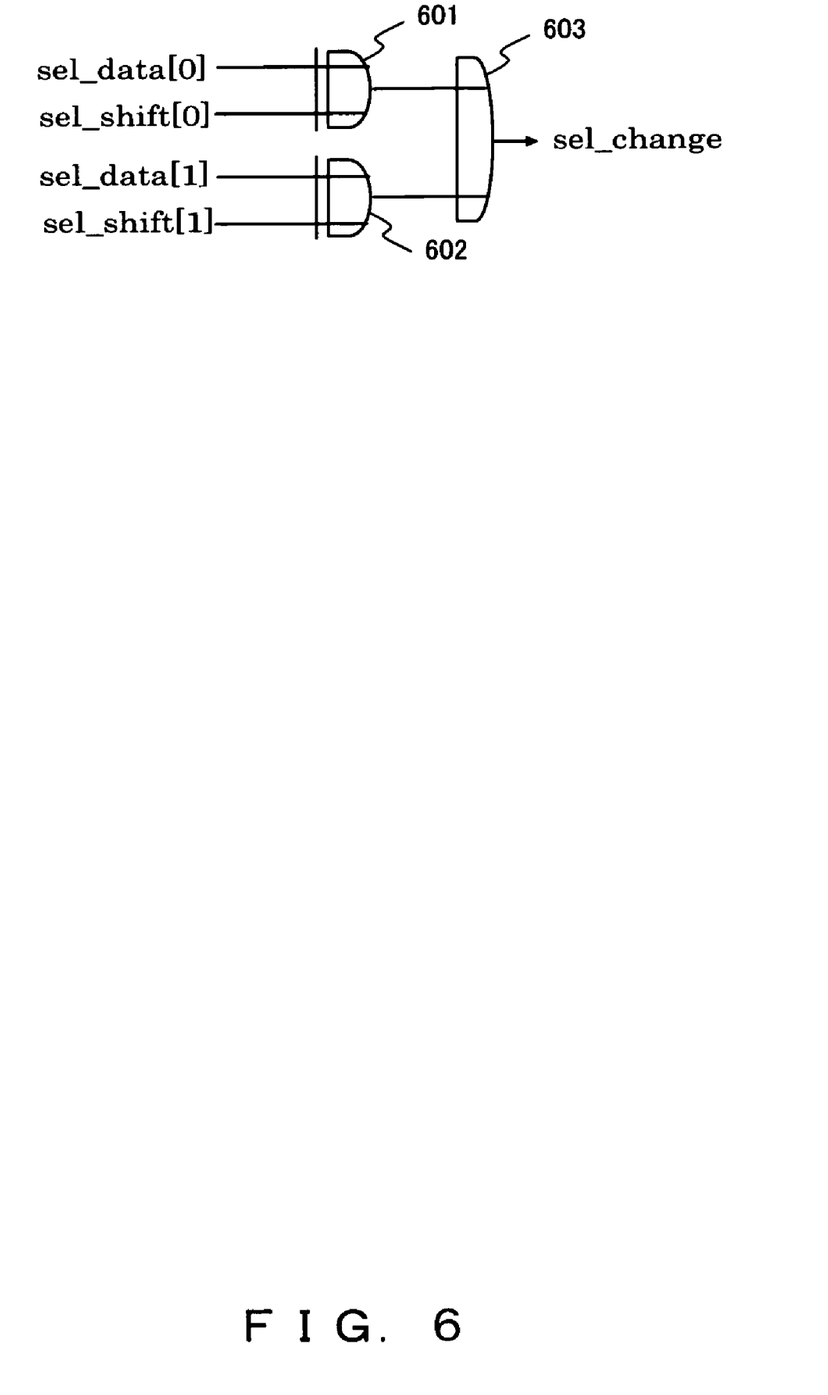
FIG. 6 shows a configuration of a comparator circuit.

As shown in FIG. 6, the comparator circuit 512 comprises an XOR circuits 601 and 602, and an OR circuit 603. The XOR circuit 601 outputs the result of the exclusive OR operation between sel_data[0] and sel_shift[0]. The XOR circuit 602 outputs the result of the exclusive OR operation between sel_data[1] and sel_shift[1][. The OR circuit 603 outputs the result of the OR operation between the output of the XOR circuit 601 and the output of the XOR circuit 602 as the signal sel_change. Thereby, the state change of the selection signal sel_data[1:0] is detected.

The direction control signal comparator circuit 506 comprises a selector 521, a latch circuit 522, and an XOR circuit 523, and compares the latest control signal dir1, dir2, dir3, or dir4 and the previous control signal sw_dir, and generates the signal dir_change indicating the comparison result.

The selector 521 selects dir1 when a value of the selection signal sel_data[1:0] is "00", selects dir2 when the value is "01", selects dir3 when the value is "10", selects dir4 when the value is "11", and outputs the selected control signal as sel_dir. The operations of the latch circuit 522 and the XOR circuit 523 are the same as those of the latch circuit 222 and the XOR circuit 223 of FIG. 3. Accordingly, the state change of the control signal sel_dir is detected based on the signal dir_change.

The hazard condition detection circuit 507 comprises AND circuits 531, 533, and 534, an inverter 532, and the selectors 535 and 536, and detects the hazard condition from the signal sel_change and the signal dir_change, and outputs the data signal sw_data_o and the control signal sw_dir_o, similarly to the hazard condition detection circuit 207 of FIG. 3.

According to the common input/output terminal control circuit as above, similarly to the case of FIG. 3, the hazard condition detection signal hazard becomes the logic "1", and the hazard condition detection circuit 507 operates such that the output of the hazard data is prevented when the conditions below (1) and (2) are satisfied simultaneously.

(1) When the value of the latest selection signal sel_data[1:0] and the value previous by two cycles are compared, it is recognized that the value has changed (the signal sel_change is the logic "1").

(2) The direction of the control signal diri of the circuit before the switching and the direction of the control signal dirj (i, j=1, 2, 3, 4, i≠j) of the circuit after the switching are different (the signal dir_change is the logic "1").

What is claimed is:

1. A common input/output terminal control circuit, comprising:
   a first data selection circuit for selecting and outputting a data signal to be transferred to a common input/output terminal from among a plurality of data signals respectively output from a plurality of circuits;
   a direction selection circuit for selecting and outputting a direction control signal of the same circuit as a circuit of the data signal output from the first data selection circuit from among a plurality of direction control signals respectively output from the plurality of circuits;

a data holding circuit for holding the data signal output from the first data selection circuit;

a second data selection circuit for selecting and outputting one of the data signal output from the first data selection circuit and the data signal held by the data holding circuit; and an output circuit for outputting, to the common input/output terminal, the data signal output from the second data selection circuit when the direction control signal output from the direction selection circuit indicates an output direction.

2. The common input/output terminal control circuit according to claim 1, wherein:

the second data selection circuit selects and outputs the data signal held by the data holding circuit when a direction indicated by the direction control signal output from the direction selection circuit is switched from an output direction to an input direction.

3. The common input/output terminal control circuit according to claim 1, further comprising:

a first detection circuit for detecting a change of a first selection signal controlling the first data selection circuit and the direction selection circuit;

a second detection circuit for detecting a change of the direction control signal output from the direction selection circuit; and a third detection circuit for detecting a hazard condition from output signals of the first detection circuit and the second detection circuit, and for outputting a second selection signal controlling the second data selection circuit.

4. The common input/output terminal control circuit according to claim 3, wherein:

the first detection circuit compares a value of the first selection signal before a prescribed time period elapses and a value of the first selection signal after the prescribed time period elapsed, and detects a change of the first data selection signal; and the second detection circuit compares a value of the direction control signal before the prescribed time period elapses and a value of the direction control signal after the prescribed time period elapsed, and detects a change of the direction control signal.

5. The common input/output terminal control circuit according to claim 3, further comprising:

a direction holding circuit for holding the direction control signal output from the direction selection circuit, wherein:

the third detection circuit changes a value of the second selection signal in accordance with a value of the direction control signal held by the direction holding circuit.

6. A common input/output terminal control circuit, comprising:

a data selection circuit for selecting and outputting a data signal to be transferred to a common input/output terminal from among a plurality of data signals respectively output from a plurality of circuits;

a first direction selection circuit for selecting and outputting a direction control signal of the same circuit as a circuit of the data signal output from the data selection circuit from among a plurality of direction control signals respectively output from the plurality of circuits;

a direction holding circuit for holding the direction control signal output from the first direction selection circuit;

a second direction selection circuit for selecting and outputting one of the direction control signal output from the first direction selection circuit and the direction control signal held by the direction holding circuit; and an output circuit for outputting, to the common input/output terminal, the data signal output from the data selection circuit when the direction control signal output from the second direction selection circuit indicates an output direction.

7. The common input/output terminal control circuit according to claim 6, wherein:

the second direction selection circuit selects and outputs the direction control signal held by the direction holding circuit when a direction indicated by the direction control signal output from the first direction selection circuit is switched from an input direction to an output direction.

8. The common input/output terminal control circuit according to claim 6, further comprising:

a first detection circuit for detecting a change of a first selection signal controlling the data selection circuit and the first direction selection circuit;

a second detection circuit for detecting a change of the direction control signal output from the first direction selection circuit; and a third detection circuit for detecting a hazard condition from output signals of the first detection circuit and the second detection circuit, and for outputting a second selection signal controlling the second direction selection circuit.

9. The common input/output terminal control circuit according to claim 8, wherein:

the first detection circuit compares a value of the first selection signal before a prescribed time period elapses and a value of the first selection signal after the prescribed time period elapsed, and detects a change of the first data selection signal; and the second detection circuit compares a value of the direction control signal before the prescribed time period elapses and a value of the direction control signal after the prescribed time period elapsed, and detects a change of the direction control signal.

10. The common input/output terminal control circuit according to claim 8, wherein:

the third detection circuit changes a value of the second selection signal in accordance with a value of the direction control signal held by the direction holding circuit.

11. A common input/output terminal control circuit, comprising:

a first data selection circuit for selecting and outputting a data signal to be transferred to a common input/output terminal from among a plurality of data signals respectively output from a plurality of circuits;

a first direction selection circuit for selecting and outputting a direction control signal of the same circuit as a circuit of the data signal output from the first data selection circuit from among a plurality of direction control signals respectively output from the plurality of circuits;

a data holding circuit for holding the data signal output from the first data selection circuit a direction holding circuit for holding the direction control signal output from the first direction selection circuit;

a second data selection circuit for selecting and outputting one of the data signal output from the first data selection circuit and the data signal held by the data holding circuit;

a second direction selection circuit for selecting and outputting one of the direction control signal output from the first direction selection circuit and the direction control signal held by the direction holding circuit; and an output circuit for outputting, to the common input/output terminal, the data signal output from the second data selection circuit when the direction control signal output from the second direction selection circuit indicates an output direction.

* * * * *